(12) United States Patent
Beuther et al.

(10) Patent No.: US 6,572,412 B2
(45) Date of Patent: Jun. 3, 2003

(54) CONTROL DEVICE AND SOLDERING METHOD

(75) Inventors: Christian Beuther, Bernhardswald (DE); Michael Tost, Geltendorf (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 10/086,298

(22) Filed: Mar. 1, 2002

(65) Prior Publication Data

US 2002/0106939 A1 Aug. 8, 2002

Related U.S. Application Data

(63) Continuation of application No. PCT/DE00/02942, filed on Aug. 31, 2000.

(30) Foreign Application Priority Data

Sep. 1, 1999 (DE) .......................... 199 41 690

(51) Int. Cl.[7] .............................................. H01R 13/66
(52) U.S. Cl. .................. 439/620; 439/381; 439/572; 439/83; 439/79; 439/76.1
(58) Field of Search ................... 439/620, 79, 76.1, 439/83, 76.2, 381, 374, 572

(56) References Cited

U.S. PATENT DOCUMENTS

| 5,244,416 | A | | 9/1993 | Masnou |
| 5,348,488 | A | * | 9/1994 | Green et al. ................. 439/140 |
| 5,699,235 | A | | 12/1997 | Tsurumiya et al. |
| 5,712,765 | A | | 1/1998 | Lehrmann et al. |
| 5,920,463 | A | * | 7/1999 | Thomas et al. ............. 123/643 |
| 6,045,397 | A | * | 4/2000 | Iwamura et al. ............ 439/493 |
| 6,171,133 | B1 | * | 1/2001 | Altuner et al. ................ 439/79 |

FOREIGN PATENT DOCUMENTS

| DE | 41 10 579 A1 | 10/1992 |
| DE | 43 11 639 A1 | 10/1994 |
| DE | 196 11 699 C1 | 11/1997 |
| DE | 197 06 790 A1 | 8/1998 |
| DE | 198 29 920 A1 | 5/1999 |
| EP | 0 854 666 A2 | 7/1998 |

* cited by examiner

*Primary Examiner*—Tho D. Ta
(74) *Attorney, Agent, or Firm*—Laurence A. Greenberg; Werner H. Stemer; Ralph E. Locher

(57) ABSTRACT

The control device has a printed circuit board with surface-mountable components. A wired component is accommodated in a plug-in connector housing that is mounted on a housing of the control device. The contact pins of the plug-in connector, the connecting wires of the wired component, and the surface-mountable components are soldered in a common working step.

7 Claims, 4 Drawing Sheets

CONTROL DEVICE AND SOLDERING METHOD

CROSS-REFERENCE TO RELATED APPLICATION

This application is a continuation of copending International Application PCT/DE00/02942, filed Aug. 31, 2000, which designated the U.S.

BACKGROUND OF THE INVENTION

Field of the Invention

The invention relates to a control device, in particular for automotive engineering, with a housing, a printed circuit board, on which surface-mountable components are soldered, and a plug-in connector, and to a method of soldering a wired component and SMT components onto a printed circuit board.

To meet the increasingly higher demands expected of the electrical functions and low-cost production of control devices in automotive engineering, discrete, powerful electrical components are increasingly being used in control circuits. However, these components often do not exist as surface-mountable components (SMD) or are only available at a far higher price than comparable wired components.

When additional wired components are used, the part of the printed circuit board loaded with SMT components is soldered by means of a reflow soldering method, and the wired components are soldered in a separate soldering process. However, various discrete components, for example electrolytic capacitors, cannot be exposed to the high temperatures which occur during reflow soldering. What is more, an additional soldering process is undesired in principle.

German published patent application DE 197 06 790 A1 discloses a control device with a printed circuit board that is loaded partly with surface-mountable components and partly with wired components. For this purpose, an opening is provided in a housing wall that must be sealed from environmental influences. On the outer side of the housing, this results in an elevation, which may hinder assembly.

European published patent application EP 0 854 666 A2 relates to a control device with a housing, in which surface-mountable components are soldered on a printed circuit board, and with a plug-in connector. A wired component is arranged near the plug-in connector. For this purpose, the housing cover has a side wall and an edge protruding beyond the plug-in connector and the wired component.

German published patent application DE 41 10 579 A1 discloses a plug-in connector for electronic control devices in motor vehicles, in which, to counter disturbing electromagnetic influences, components are attached to the outer side of the plug-in connector.

U.S. Pat. No. 5,444,416 discloses a digital demodulation device, in which, to counter disturbing influences, wired components are attached by printed circuit board in a cavity of the plug-in connector.

Finally, U.S. Pat. No. 5,712,765 discloses an electronics module with a housing, a printed circuit board, and a plug-in connector. The plug-in connector is fastened in the assembled state on the printed circuit board and receives an electronic component arranged on the printed circuit board in order to improve the heat dissipation from the electronic component. The electronic components are thereby arranged on the printed circuit board before the assembly of the plug-in connector and subsequently soldered, so that the assembly of the plug-in connector and the preassembly of the electronic components on the printed circuit board form separate working steps.

SUMMARY OF THE INVENTION

It is accordingly an object of the invention to provide a control device and a soldering method, which overcomes the above-mentioned disadvantages of the heretofore-known devices and methods of this general type and which provide for a control device and a method of soldering at least one wired component and surface-mountable components onto a printed circuit board which make it possible for control devices to be produced in an efficient, low-cost way which saves installation space.

With the foregoing and other objects in view there is provided, in accordance with the invention, a control device, comprising:

a housing;

a circuit board with surface-mounted components soldered thereto;

a plug-in connector having contact pins;

a plug-in connector housing formed with a cavity and a wired component disposed in the cavity and fastened to the plug-in connector housing, the wired component having connecting wires;

the plug-in connector having a centering aid with a grid for the contact pins of the plug-in connector and for connecting wires of the wired component.

With the above and other objects in view there is also provided, in accordance with the invention, a method of soldering wired components and surface-mountable components on a printed circuit board. The method comprises:

loading a printed circuit board with surface-mountable components;

fitting a wired component into a plug-in connector;

placing the plug-in connector on the printed circuit board such that contact pins and connecting wires of the wired component protrude through the printed circuit board; and soldering the contact pins, the connecting wires, and the surface-mountable components onto the printed circuit board in a common process step.

Preferably, the method sequence comprises firstly fitting the wired component into a component housing and subsequently fitting the component housing into the plug-in connector.

By accommodating one or more wired components in the plug-in connector housing, it is possible to dispense with a separate placement of the wired component or components on the printed circuit board. A wired component is fitted together with the contact pins of the plug-in connector in corresponding plated through holes of the printed circuit board.

In a particularly preferred embodiment, a wired component is encapsulated by the plug-in connector housing, so that components which are not suitable for the very high temperatures occurring during a reflow soldering method can nevertheless be soldered at temperatures of 200° C. and above. In this way, for example, electrolytic capacitors which may be exposed to a maximum temperature of 125° C. can be soldered in a reflow soldering furnace.

Accommodating the wired component in the plug-in connector allows the surface area of the printed circuit board to be reduced. This is particularly advantageous if a printed circuit board can only be loaded on one side, in order for example to be brought into contact with a heat sink on one side. If in this case the printed circuit board is attached with one side to a housing inner wall and the plug-in connector is attached on the housing outer wall facing away from the printed circuit board, a particularly compact housing with a small enclosed air volume can be realized. For this purpose, the surface-mountable components (SMD) and the wired component are ideally soldered onto the same printed circuit board.

The plug-in connector housing may be formed in one piece with the housing wall or the housing cover. If a metallic, metallized or conductive material is used, particularly good shielding of the control device with respect to electro-magnetic interferences can be achieved.

The invention is particularly suitable for use in control devices of motor vehicles, and in particular for engine control devices.

Other features which are considered as characteristic for the invention are set forth in the appended claims.

Although the invention is illustrated and described herein as embodied in a control device and soldering method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
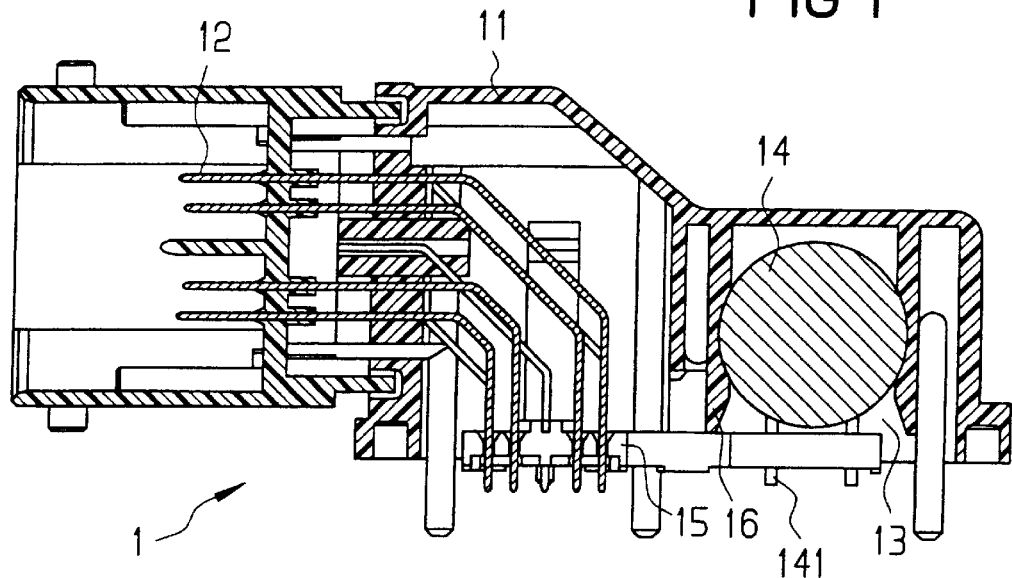
FIG. 1 is a sectional view of a plug-in connector.

Referring now to the figures of the drawing in detail and first, particularly, to FIG. 1 thereof, there is shown a plug-in connector 1 with a plug-in connector housing 11. Arranged in the plug-in connector housing 11 are contact pins 12 and, in a cavity 13, a wired component 14 with connecting wires 141. The wired component 14 is an electrolytic capacitor. Fitted in the plug-in connector housing 11 is a centering aid 15 with a grid for the contact pins 12 and the connecting wires 141. The centering aid 15 aligns the contact pins and the connecting wires with a corresponding grid of a printed circuit board with which an electrical contact is to be established.

The plug-in connector housing 11 consists of a plastics material. The cavity 13 is bounded by parallel webs 16. The webs 16 have depressions or hollows, in which the wired component 14 is locked and held. The webs 16 are formed in one piece with the plug-in connector housing 11. The webs are also formed of the plastics material.

Figure 2:
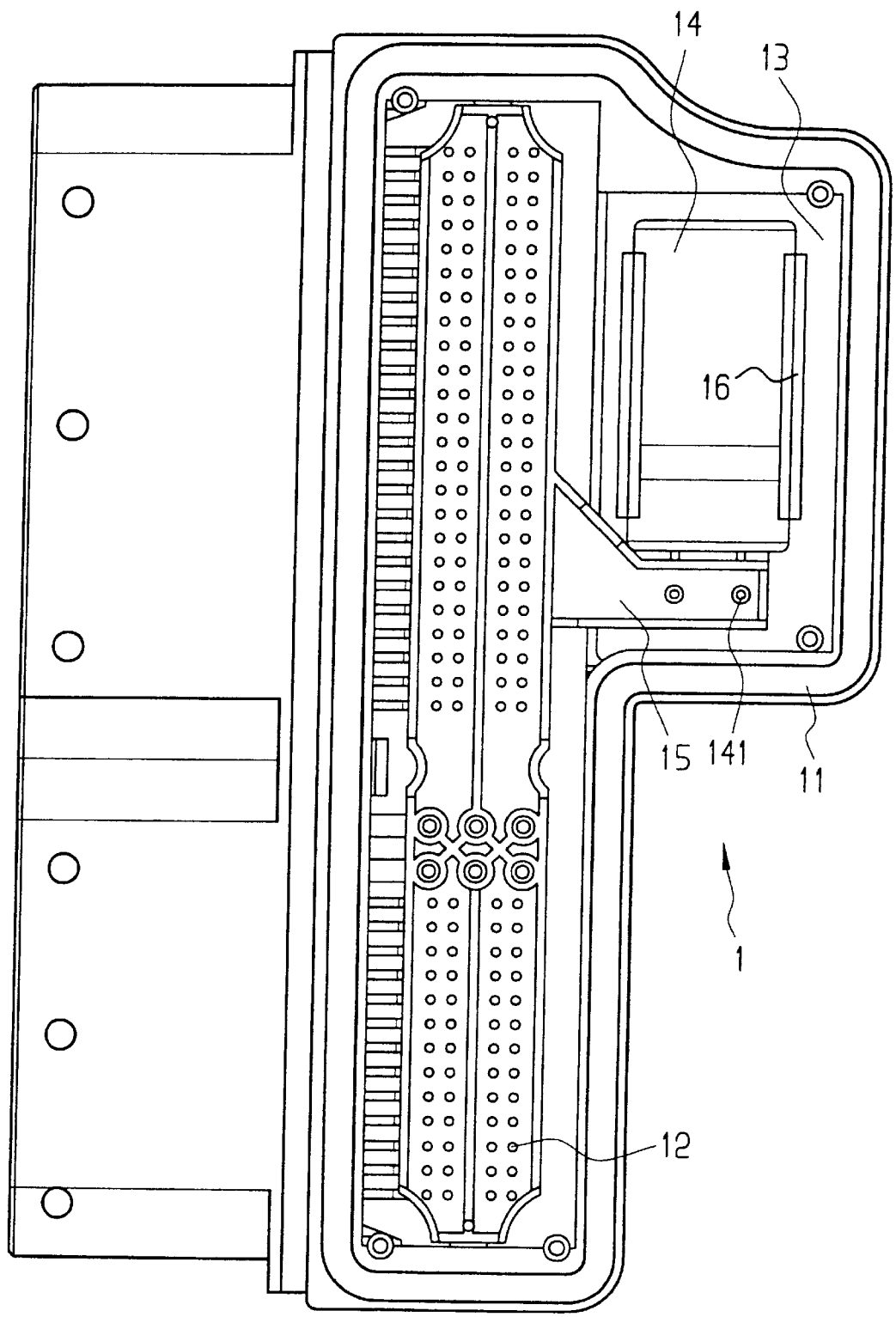
FIG. 2 is a bottom view from below of the plug-in connector illustrated in FIG. 1.

FIG. 2 shows the centering aid 15 fixed on the underside of the plug-in connector housing 11. It guides the contact pins 12 and the connecting wires 141 in a defined grid.

The wired component, as described above, is embraced by legs or webs 16.

Figure 3:
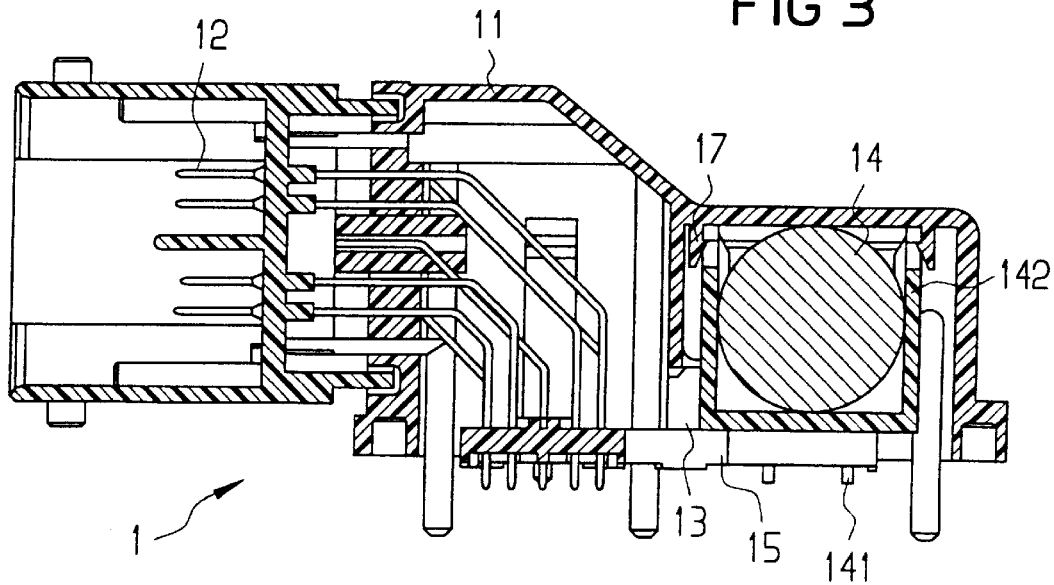
FIG. 3 is a sectional view of a plug-in connector, into which a component housing with a wired component has been fitted.

A plug-in connector 1 is represented in FIG. 3 which receives a component housing 142 in the cavity 13. Before the component housing 142 was installed into the plug-in connector housing 11, the wired component 14 was fitted into the component housing. The component housing 142 is in turn locked in the plug-in connector housing 11 by lugs 17.

Figure 4:
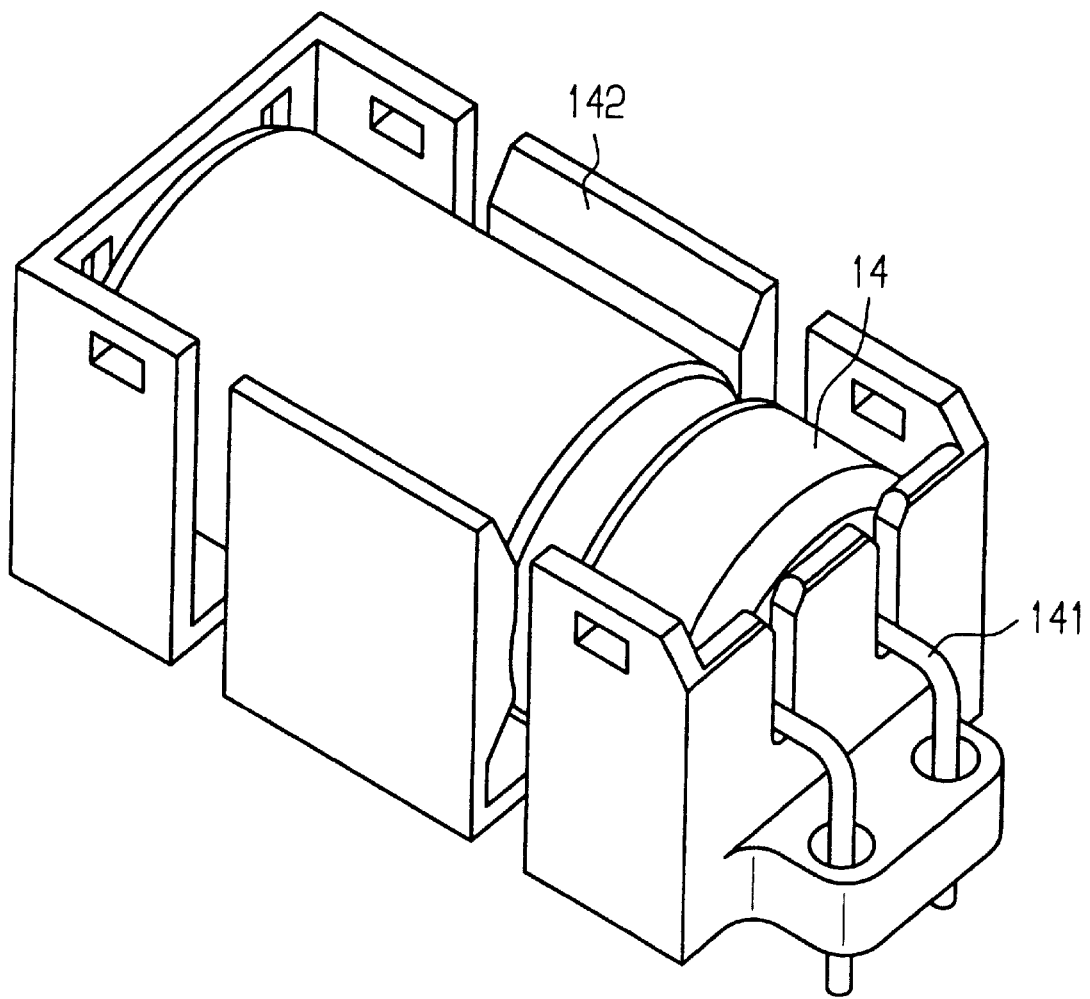
FIG. 4 is a perspective view of a component housing with a wired component.

FIG. 4 represents an electrolytic capacitor fitted into such a component housing 142, before it has been fitted into a connector housing. The capacitor is frictionally held by central, parallel wall portions of the component housing 142. These wall portions are respectively delimited from the end pieces of the component housing by two slots, which extend over part of the periphery of the component housing. The slots give the central portion of the component housing 142 adequate flexibility to bend up during the fitting of the electrolytic capacitor or the wired component 14.

The connecting wires 141 of the electrolytic capacitor run through a vertical slot of a longitudinal wall of the component housing, are bent through 90° outside the component housing and are directed through a continuation of the component housing. This continuation has vertical openings for the leading through of the connecting wires 141. The axes of the vertical holes are aligned parallel to the longitudinal wall of the component housing 142.

Figure 5:
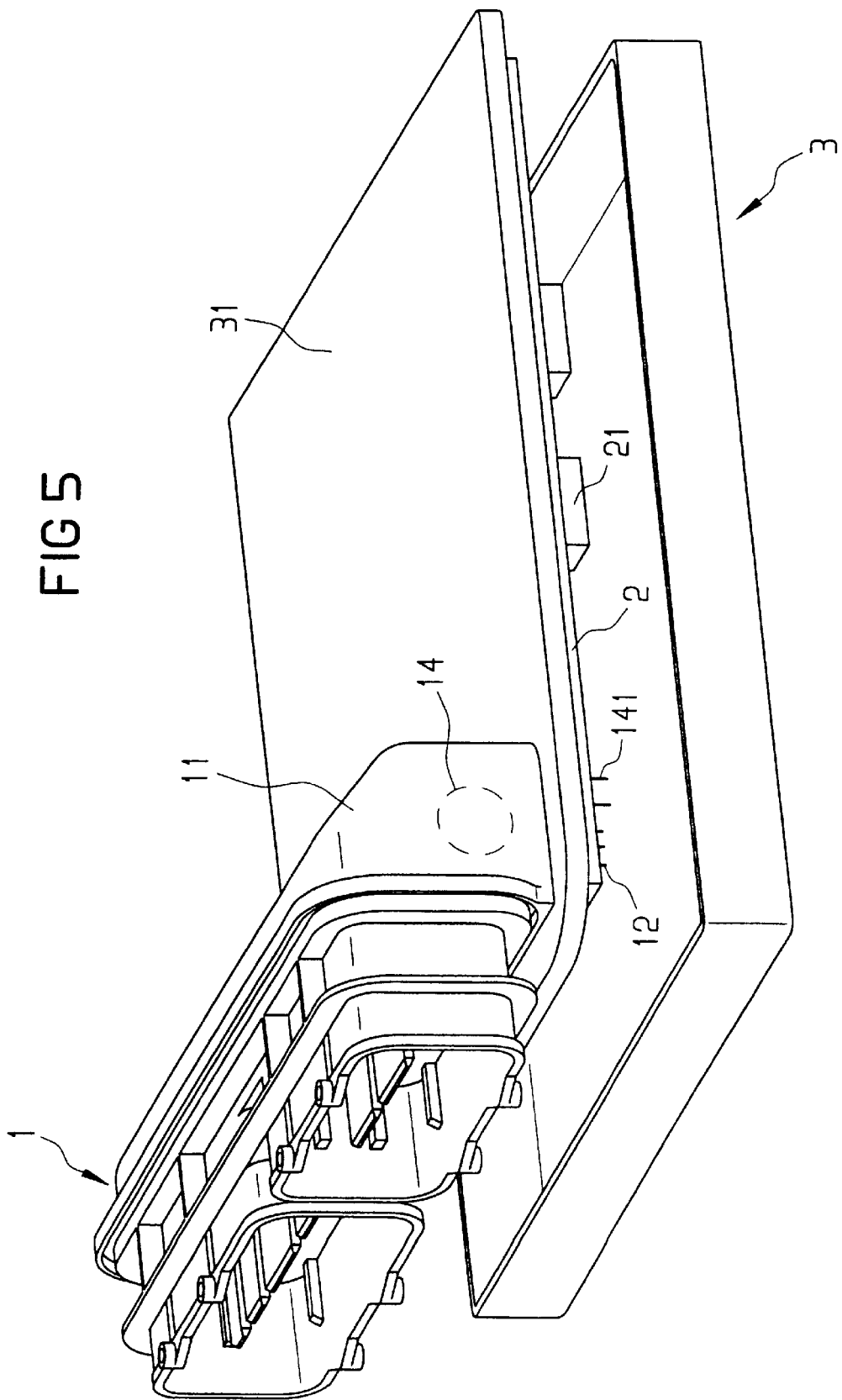
FIG. 5 is a perspective view of a control device in which a plug-in connector has been soldered onto a printed circuit board.

FIG. 5 shows a control device with a metallic housing 3. The plug-in connector 1 has a hood-like plug-in connector housing 11, which is produced in one piece with a metallic housing cover or a housing wall 31. A wired component 14 with connecting wires 141 is arranged in the plug-in connector 1.

Both the connecting wires 141 and the ends of the contact pins 12 protrude through a printed circuit board 2.

The printed circuit board 2 is adhesively bonded with one side onto a housing cover 31 directly by means of a heat conducting adhesive. The other side of the printed circuit board 2 is loaded with surface-mountable components 21. On this loading side, both the ends of the contact pins 12 and the connecting wires 141 protrude. They can therefore be soldered together with the surface-mountable components (SMDs) in one operation in a reflow furnace. The wired component 14 is in this case shielded from direct exposure to the heat in the oven by the plug-in connector 11.

After the soldering process, the housing cover with the plug-in connector 1 and the printed circuit board 2 is placed onto a shell-like housing part and the housing is consequently closed. The housing volume enclosed by the shell-like housing part and the housing cover 31 is small, so that only a small exchange of air with the surroundings is necessary when a control device heats up and cools down. It has therefore been possible to keep the height of the housing very flat, since the relatively bulky electrolytic capacitor is accommodated outside the inner space of the housing in the plug-in connector housing 11.

Only surface-mountable components are fastened on the printed circuit board 2. Wired components are only accommodated and mechanically held in the plug-in connector housing 11.

On account of the attachment of the wired component 14 in the connector housing, the wired component 14 can be fixed securely with respect to vibration in a particularly easy way, since the plug-in connector housing 11 can provide a far better support than a planar printed circuit board. In particular, the wired component 14 can be encapsulated in the cavity 13.

We claim:

1. A control device, comprising:

a housing;

a circuit board with surface-mounted components soldered thereto;

a plug-in connector having contact pins;

a plug-in connector housing formed with a cavity and a wired component disposed in said cavity and fastened to said plug-in connector housing, said wired component having connecting wires;

said plug-in connector having a centering aid with a grid for aligning said contact pins of said plug-in connector and connecting wires of said wired component with a corresponding grid of said circuit board.

2. The control device according to claim 1, wherein said surface-mounted components and said wired components are soldered to one and the same printed circuit board.

3. The control device according to claim 1, wherein said wired component is locked in said plug-in connector.

4. The control device according to claim 1, which further comprises a housing cover to which said printed circuit board is fastened, and wherein said plug-in connector is arranged on a side of said housing cover facing away from said printed circuit board such that said wired component is arranged outside an interior space enclosed by said housing.

5. The control device according to claim 4, wherein said plug-in connector housing and said housing cover are formed from a single workpiece.

6. A method of soldering wired components and surface-mountable components on a printed circuit board, which comprises:

loading a printed circuit board with surface-mountable components, the printed circuit board having a grid for electrical connection of a wired component;

fitting a wired component with connecting wires into a plug-in connector with contact pins;

aligning the connecting wires of the wired component and the contact pins of the plug-in connector with a centering aid to define a grid corresponding to the grid of the printed circuit board;

placing the plug-in connector on the printed circuit board to align the grid of the plug-in connector with the grid of the printed circuit board; and soldering the contact pins, the connecting wires, and the surface-mountable components onto the printed circuit board in a common process step.

7. The method according to claim 6, which comprises firstly fitting the wired component into a component housing and subsequently fitting the component housing into the plug-in connector.

* * * * *